(12) United States Patent
Tsuruoka et al.

(10) Patent No.: US 7,829,135 B2
(45) Date of Patent: Nov. 9, 2010

(54) METHOD AND APPARATUS FOR FORMING MULTI-LAYERED CIRCUIT PATTERN

(75) Inventors: Yuji Tsuruoka, Kawasaki (JP); Takashi Mori, Ohta-ku (JP); Nobuhito Yamaguchi, Inagi (JP); Masao Furukawa, Yokohama (JP); Seiichi Kamiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 11/447,395

(22) Filed: Jun. 6, 2006

(65) Prior Publication Data

US 2006/0292293 A1    Dec. 28, 2006

(30) Foreign Application Priority Data

Jun. 22, 2005   (JP)   ............................. 2005-181667

(51) Int. Cl.
*C23C 28/00*   (2006.01)
(52) U.S. Cl. ...................................................... 427/96.8
(58) Field of Classification Search ................. 428/901; 427/96.1, 299, 466
See application file for complete search history.

(56) References Cited

U.S. PATENT DOCUMENTS

| | | | |
|---|---|---|---|
| 5,438,167 A * | 8/1995 | McClanahan | 174/264 |
| 6,503,831 B2 * | 1/2003 | Speakman | 438/674 |
| 6,660,332 B2 | 12/2003 | Kawase | |
| 2003/0227509 A1 * | 12/2003 | Usuda | 347/35 |
| 2004/0000429 A1 * | 1/2004 | Furusawa et al. | 174/264 |

FOREIGN PATENT DOCUMENTS

| | | | |
|---|---|---|---|
| JP | 09-018116 | | 1/1997 |
| JP | 11-163499 A | | 6/1999 |
| JP | 2002-221616 | * | 8/2002 |
| JP | 2004-105948 | | 4/2004 |
| JP | 2004-320003 | | 11/2004 |

* cited by examiner

*Primary Examiner*—Michael Cleveland
*Assistant Examiner*—Tabassom Tadayyon Eslami
(74) *Attorney, Agent, or Firm*—Canon U.S.A., Inc., IP Division

(57) ABSTRACT

In the process of forming, on a substrate, a multi-layered circuit pattern with layers each having a portion made of the same material throughout the different layers in the direction in which the different layers are stacked, the position of nozzles with respect to the substrate when at least one of the layers is formed is shifted from that when the other layers are formed.

6 Claims, 10 Drawing Sheets

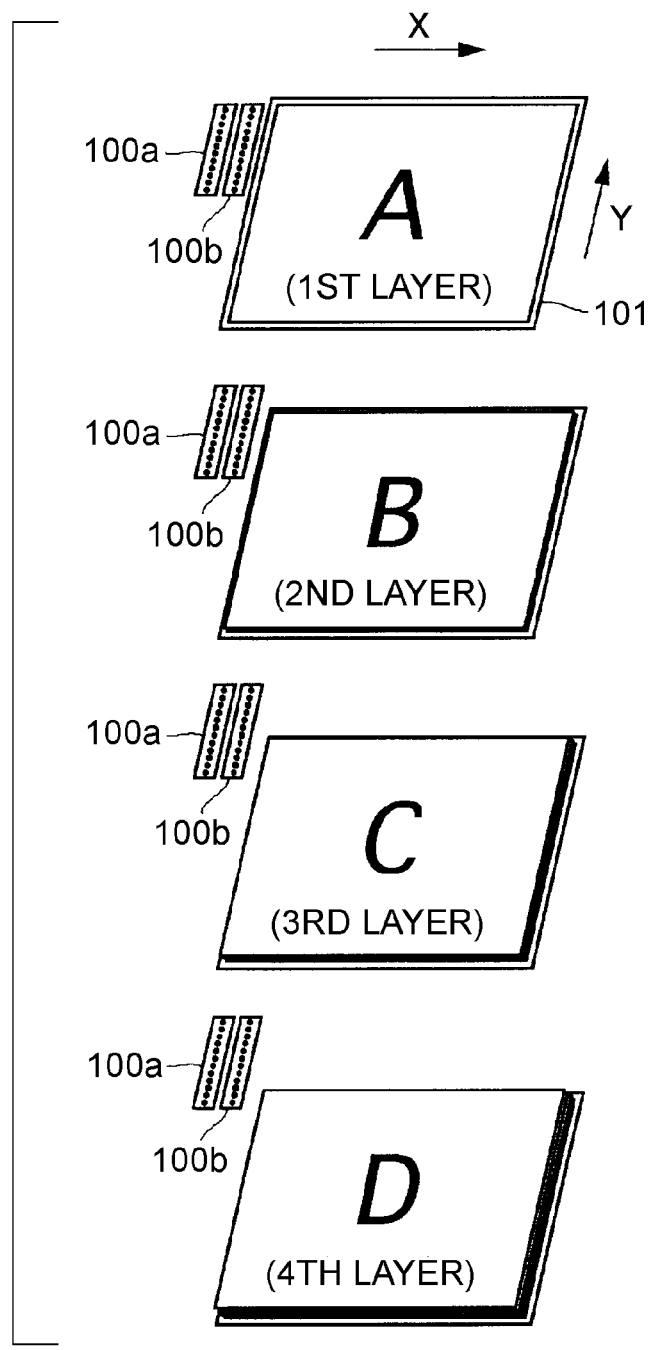

METHOD AND APPARATUS FOR FORMING MULTI-LAYERED CIRCUIT PATTERN

BACKGROUND OF THE INVENTION

1. Field of the Invention

The present invention relates to methods and apparatuses for forming multi-layered circuit patterns widely used in electronic devices.

2. Description of the Related Art

A multi-layered circuit board having a multi-layered circuit on which semiconductor devices, including a large-scale integration (LSI) circuit, and various electronic parts are mounted is now widely used as the heart of electronic devices, communication devices, computers, and the like. A typical substrate of a multi-layered circuit board to be used for such purposes is made of a composite material containing a reinforcing material (e.g., ceramic or fiberglass) and plastic (e.g., epoxide resin). Some types of substrate for a circuit board to be mounted in compact equipment, such as mobile phones and cameras, are made of a flexible material (e.g., polyester resin or aramid resin) that can contribute to improved mountability of the circuit board. Recently, as the size of electronic devices decreases and their board density increases, multi-layered circuit boards with 8 or 16 layers have become mainstream while, previously, most circuit boards were single-side and double-side boards. At the same time, as the operating speed of electronic circuits increases, the fineness and density of circuit patterns are increasing rapidly.

There are various methods for forming a circuit pattern on a circuit board. For example, Japanese Patent Laid-Open No. 11-163499 discusses a method in which a conductive pattern forming solution (which exhibits conductivity) and an insulating pattern forming solution (which exhibits insulation properties) are simultaneously ejected from a liquid ejection head, such as an inkjet recording head, onto the surface of a substrate, on which a conductive pattern and an insulating pattern are drawn to create a complete circuit pattern layer, which is then stacked on top of one another to form a multi-layered circuit. However, since this method causes the mixing of the conductive pattern forming solution and the insulating pattern forming solution at the boundary between these solutions and causes smearing of the circuit pattern, it is difficult to achieve a fine and high-density circuit pattern.

However, to achieve a high-density circuit board, it is essential to stack multiple layers of circuit patterns. A liquid ejection method has an advantage over a known subtractive process in that the liquid ejection method can facilitate the stacking of multiple layers, as it can allow the formation of a circuit pattern with a thickness of only several to several tens of micrometers. However, the amount of droplets ejected from each of a plurality of nozzles in a liquid ejection head varies. For example, as shown in FIG. 8A to FIG. 8C, the nozzle configuration in a nozzle assembly 1003 of a liquid ejection head 1002 affects the distribution of droplets 1004 and causes variations in the thickness of a circuit pattern 1005 formed on a substrate 1001. In most cases, variations in the amount of the droplets 1004 occur in the process of manufacturing the liquid ejection head 1002 and are caused by multiple factors. Some factors may cause a random distribution of the droplets 1004 regardless of the nozzle configuration, whereas other factors may cause the droplets 1004 to be distributed as shown in FIG. 8A, 8B, or 8C. In FIG. 8A, the amount of the droplets 1004 at each end of the nozzle row is smaller than that in the middle thereof. In FIG. 8B, the amount of the droplets 1004 in one-half of the nozzle row is smaller than that in the other half thereof. In FIG. 8C, the amount of the droplets 1004 gradually increases from left to right along the nozzle row. In a liquid ejection head used in typical printers and apparatuses for creating circuit boards, variations in the amount of droplets ejected from different nozzles are normally 20% or less, which has not caused any problems to date in producing a multi-layered circuit board with four layers or less.

However, such variations in the amount of droplets cannot be accommodated in a multi-layered circuit with ten or more layers, which is becoming mainstream in recent years. FIG. 3A and FIG. 3B illustrate a multi-layered circuit board produced by stacking multiple circuit patterns formed with a liquid ejection head having the above-described configuration which causes variations shown in FIG. 8A. For easy understanding, FIG. 9A and FIG. 9B illustrate a four-layered circuit board produced by sequentially stacking the first through fourth layers with a liquid ejection head which can cause considerable variations, which are as high as 50%, in the amount of droplets ejected from different nozzles. This means that, in this circuit board, each layer has a level difference of about half the thickness thereof. As the stacking process proceeds, a level difference in each layer accumulates to a considerable level in the resulting four-layered circuit board. Generally, no significant problems arise if this resulting level difference is smaller than the thickness of a single circuit pattern layer. However, if a level difference which is larger than the thickness of a single circuit pattern layer is produced in a conductive pattern, the conductive pattern will be cut, and the circuit can be easily broken. If a level difference which is larger than the thickness of a single circuit pattern layer is produced in an insulating pattern, the resulting poor insulation or short circuit between patterns can lead to a critical failure in the circuit board. As described above, in a liquid ejection head generally used, variations in the amount of droplets ejected from different nozzles are normally 20% or less. This causes no problems in a four-layered circuit board, as a level difference in the four-layered circuit board is equal to or smaller than the thickness of a single layer. However, in a circuit board with five or more layers, it is highly likely that a failure in a circuit pattern occurs, as a level difference in such a circuit board is larger than the thickness of a single layer.

To produce a circuit board which extends over the length of the nozzle row of the liquid ejection head 1002 in FIG. 8A to FIG. 8C, first, as shown in FIG. 10A, the circuit pattern 1005 corresponding to the length of the nozzle row is formed in a drawing area. Next, as shown in FIG. 10B, the liquid ejection head 1002 is moved by the length of the nozzle row to form a circuit pattern 1006 in the next drawing area. The cross-sectional profile of each layer of the circuit pattern 1006 is the same as that of the circuit pattern 1005, in which a considerable level difference is produced.

Variations in the thickness of such a circuit pattern are caused not only by variations in the amount of the droplets 1004 ejected from different nozzles. As shown in FIG. 10C, unevenness on the surface of the circuit pattern 1005 is produced when the direction of the droplets 1004 ejected from nozzles vary among the nozzles.

Again, in most cases, variations in ejection direction are caused by problems in the process of manufacturing the liquid ejection head 1002. As in the case of variations in the amount of the droplets 1004, variations in ejection direction can occur randomly regardless of the nozzle configuration. There may be other cases where variations in ejection direction occur due to the configuration of specific nozzles in the nozzle row.

SUMMARY OF THE INVENTION

The present invention is directed to a method of forming a multi-layered circuit pattern which smoothes out variations in the thickness of the circuit pattern with multiple layers stacked on a substrate. According to one aspect of the present invention, a method includes forming a multi-layered circuit pattern on a substrate by ejecting solutions onto the substrate from a liquid ejection head with a nozzle row including a plurality of nozzles while repeating relative scanning movement between the liquid ejection head and the substrate in order to stack multiple layers of the multi-layered circuit pattern. During forming the multi-layered circuit pattern, each having a portion made of the same material throughout the different layers in the stacking direction, the position of nozzles with respect to the substrate when at least one of the different layers is formed is shifted from that when the other layers are formed. This can prevent the circuit pattern from being short-circuited or broken.

Variations in the thickness of a circuit pattern caused by variations in the amount and direction of droplets ejected from a liquid ejection head can be smoothed out and thus, uniformity in the thickness of a multi-layered circuit can be achieved regardless of the number of layers in the multi-layered circuit. Moreover, since level differences that occur at boundaries between adjacent scans can be distributed through the stacking of multiple layers, it is possible to provide a high-quality multi-layered circuit board that has excellent uniformity in thickness and thus is resistant to short-circuiting and breaking caused by variations in the thickness of the circuit pattern.

Further features of the present invention will become apparent from the following description of exemplary embodiments with reference to the attached drawings.

BRIEF DESCRIPTION OF THE DRAWINGS

FIG. 2 shows a process of forming a multi-layered circuit board according to a first exemplary embodiment of the present invention.

DESCRIPTION OF THE EMBODIMENTS

Figure 1A:
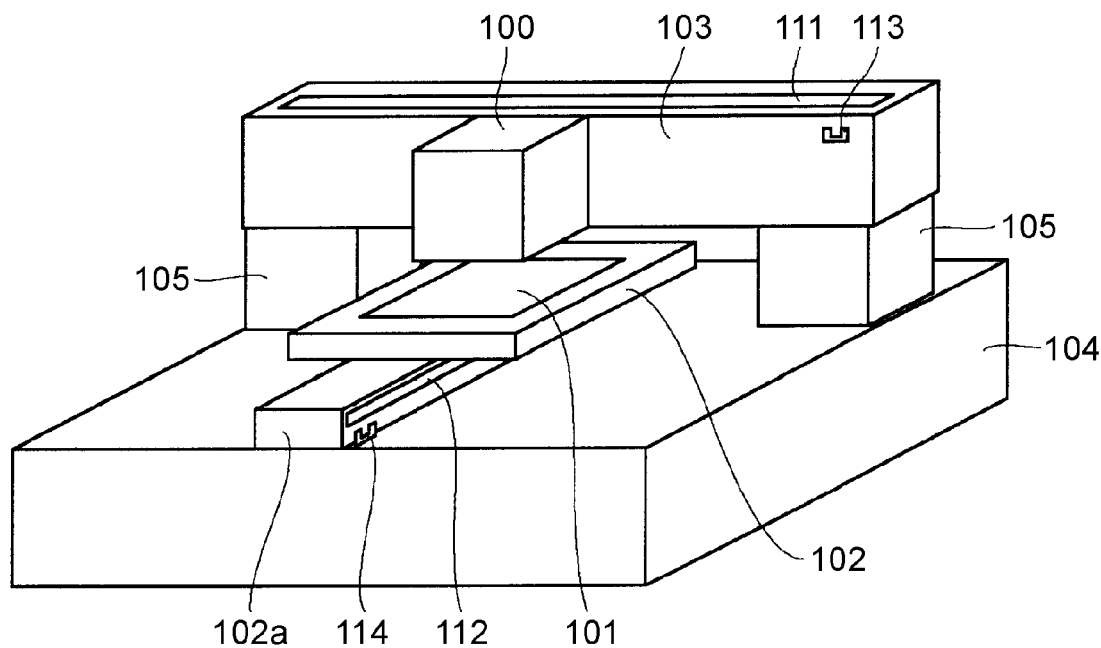
FIG. 1A is an overall perspective view of an apparatus for forming a multi-layered circuit pattern according to at least one exemplary embodiment of the present invention.
Figure 1B:
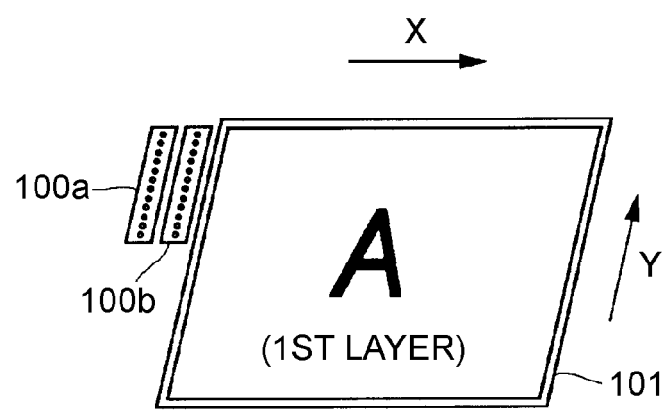
FIG. 1B illustrates a circuit pattern and liquid ejection heads of a carriage shown in FIG. 1A.

FIG. 1A and FIG. 1B show an apparatus for forming a multi-layered circuit pattern according to at least one exemplary embodiment of the present invention. A carriage 100, serving as a main scanning unit, includes two heads (liquid ejection heads) 100a and 100b and their corresponding tanks (not shown) for supplying a conductive pattern forming solution and an insulating pattern forming solution to the heads 100a and 100b. Each of the heads 100a and 100b has a nozzle row including a plurality of nozzles. A conductive pattern forming solution and an insulating pattern forming solution, which are both circuit pattern forming solutions, are ejected from these nozzles of the heads 100a and 100b onto a substrate 101.

A typical conductive pattern forming solution can contain a metal colloid, such as an aluminum (Al) colloid, a silver (Ag) colloid, or a stannic oxide ($SnO_2$) colloid in view of their conductivity. For uniformity and stability of a circuit pattern, a metal colloid with a particle diameter ranging from several tens of nanometers to several hundreds of nanometers can be used. On the other hand, while a typical insulating pattern forming solution contains insulating particulates, such as silica, alumina, calcium carbonate, or magnesium carbonate particulates, any type of insulating pattern forming solution can be used, as long as it ultimately exhibits insulating properties.

The substrate 101 can be a porous ceramic substrate produced by sintering alumina, silica, aluminum nitride, barium titanate, or zirconia powder; or a porous resin film or a fiberglass substrate mostly made of polyolefin and an inorganic filler. As will be described below, when a process of forming a circuit pattern involves a heating and fixing step or a burning step, a porous ceramic substrate, which is heat resistant, can be used.

The substrate 101 is placed on a stage 102 serving as a sub-scanning unit. The carriage 100 is configured such that it can be moved over the stage 102 by a carriage (CR) linear motor 103, serving as a driving unit, in a main scanning direction. A line feed (LF) linear motor 102a serves as a driving unit that moves the stage 102 in a sub-scanning direction orthogonal to the main scanning direction. The LF linear motor 102a is secured to a surface plate 104 while maintaining its high stiffness. Therefore, the surface of the stage 102 on which the substrate 101 is to be placed is consistently parallel to the surface of the surface plate 104 even if the stage 102 is moved. The CR linear motor 103 is secured to the upper surface of the surface plate 104 while maintaining its high stiffness, with a pair of base supports 105 disposed between the CR linear motor 103 and the surface plate 104. The carriage 100 is adjusted to move along a scanning path parallel to the surface of the surface plate 104, that is, to the surface of the stage 102. The CR linear motor 103 and the LF linear motor 102a include linear encoders 111 and 112, respectively, and also include origin sensors 113 and 114, respectively. Inputs from the linear encoders 111 and 112 and origin sensors 113 and 114 are used for servo control performed when the CR linear motor 103 and the LF linear motor 102a move. At the same time, the linear encoder 111 is used for controlling the timing at which a conductive pattern forming solution and an insulating pattern forming solution are to be ejected.

The linear encoders 111 and 112 have a resolution as high as 0.5 μm, which is sufficient for forming a circuit pattern with a width of several tens of micrometers. Drawing data corresponding to a circuit pattern to be formed is transmitted from a computer (not shown) connected to the present apparatus.

On the basis of the drawing data transmitted from the computer, the LF linear motor 102a moves the stage 102 to a predetermined position. Then, as in FIG. 1B, while the carriage 100 is being moved by the CR linear motor 103, a conductive pattern forming solution and an insulating pattern forming solution are ejected from the heads 100a and 100b onto the substrate 101. By repeating this process, a circuit pattern including a conductive pattern and an insulating pattern can be drawn on the substrate 101. The stage 102 supporting the substrate 101 is embedded with a heater, which serves as a fixing unit that can heat each pattern and facilitate the fixing of the circuit pattern.

Since the present apparatus allows a circuit pattern to be drawn and immediately fixed, layers of circuit patterns can be sequentially stacked on top of one another to form a multi-layered circuit pattern. However, in the circuit pattern formed by the present apparatus, solvent contained in each of the solutions remains. A metal colloid for developing conductivity also remains without changing its state. Therefore, to further improve the performance of a circuit board in terms of electrical insulation properties and conductivity, solvent remaining in the multi-layered circuit pattern formed by the present apparatus should be completely removed. Also, for sintering the metal colloid powder to allow conductivity to occur, a baking process should be carried out by a baking apparatus that is separate from the present apparatus.

The fixing process and the baking process do not necessarily have to be performed according to the method described above. For example, only the fixing process can be performed every time a layer is formed, or both the fixing process and the baking process can be performed every time a layer is formed. Alternatively, a baking process that also has the effects of a fixing process can be performed every time a layer is formed. At the same time, the fixing unit is not limited to the heater described above.

Figure 7:
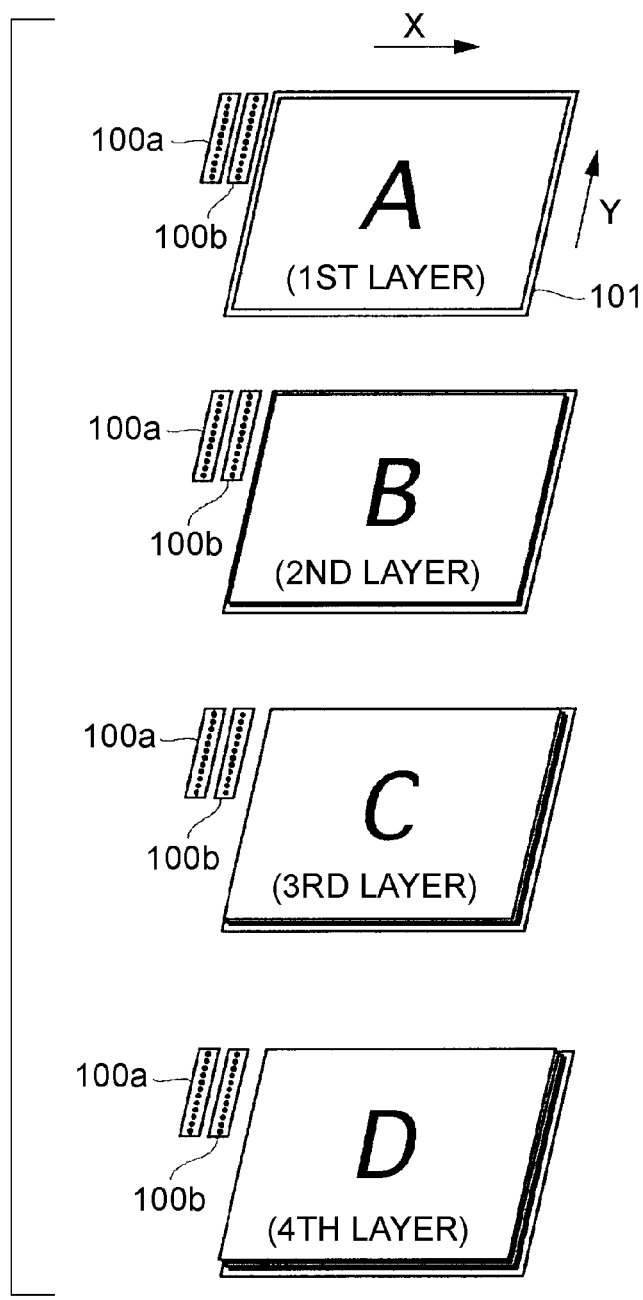
FIG. 7 shows a known process of forming a multi-layered circuit board.

For reference purposes, the following describes a known method for forming a multi-layered circuit pattern. As shown in FIG. 7, a conductive pattern forming solution and an insulating pattern forming solution are ejected from the two heads 100a and 100b included in the carriage 100.

First, when the stage 102 is moved to a drawing start position to form a circuit pattern A (first layer), drawing data for the first scan is transmitted from a computer. This allows the carriage 100 to start moving across the substrate 101. While the head 100a, serving as a "conductive" head, and the head 100b, serving as an "insulating" head, scan across the substrate 101 in the main scanning direction (X direction), a conductive pattern forming solution and an insulating pattern forming solution are ejected from the head 100a and the head 100b, respectively, onto the substrate 101 according to the drawing data. Upon completion of the first scan, the stage 102 is moved, for the drawing of the next section, in a stage moving direction (Y direction) by the drawing width of the heads 100a and 100b (i.e., by the length of the nozzle rows). Then, drawing data for the second scan is transmitted from the computer, and the carriage 100 starts moving across the substrate 101. As in the case of the first scan, solutions corresponding to the drawing data for the second scan are ejected onto the substrate 101. Thereafter, similar operations are repeated until the formation of the circuit pattern A is completed. Upon completion of the drawing of the circuit pattern A, the heater embedded in the stage 102 heats and fixes the circuit pattern A to the substrate 101. Upon completion of the process of fixing the circuit pattern A, the circuit pattern B (second layer) is formed over the circuit pattern A, which serves as a substrate. Thereafter, the circuit pattern C (third layer) and the circuit pattern D (fourth layer) are sequentially stacked to form a complete multi-layered circuit pattern board with four layers.

In the known method described above, the position of the heads 100a and 100b with respect to the substrate 101 in the sub-scanning direction (Y direction), in other words, the drawing start position (nozzle position) in the stage moving direction is kept fixed throughout the entire process of forming the complete multi-layered circuit pattern. This known method has advantages in that, for example, it can simplify the process of image editing performed by the computer and can minimize the time required for drawing.

However, in this method, when layers of circuit patterns are formed with the same nozzle rows, the degree of unevenness on top of the stacked circuit patterns increases as the stacking process proceeds as shown in FIG. 3. This may lead to a critical failure in the multi-layered circuit board.

To avoid such problem, patterns formed with the same nozzle need to be prevented from overlapping in layers in the stacking direction. That is, since only a single type of circuit pattern forming material can be ejected from a single nozzle, it is possible that portions formed of the same material overlap in layers in the stacking direction. Therefore, if a nozzle position with respect to the substrate is varied depending on the layer, patterns formed with the same nozzle can be prevented from overlapping in layers in the stacking direction.

Specifically, as shown in FIG. 2 through FIG. 6, when at least one single circuit pattern layer is formed, the nozzle position of at least one of the heads 100a and 100b can be shifted in the direction of the nozzle row that is substantially orthogonal to the main scanning direction so that the nozzle position can be prevented from overlapping with the nozzle position when the other circuit pattern layers are formed. For this purpose, for example, a displacement unit for displacing the heads 100a and 100b in the sub-scanning direction or in the rotation direction is mounted on the carriage 100.

Another possible method is to use a head with a plurality of nozzle rows for ejecting a single material. In this case, to form layers of circuit patterns each having a portion formed of the same material throughout the different layers in the stacking direction, the head is displaced along the main scanning direction (X direction) in each layer while the position of the head in the sub-scanning direction (Y direction) with respect to the substrate is kept fixed throughout the process of forming different layers. In other words, since a different nozzle row is used to form a portion of the same material in each layer in the stacking direction, variations that are unique to each nozzle row are compensated and similar effects to those in the above-described cases can be achieved.

Figure 9:
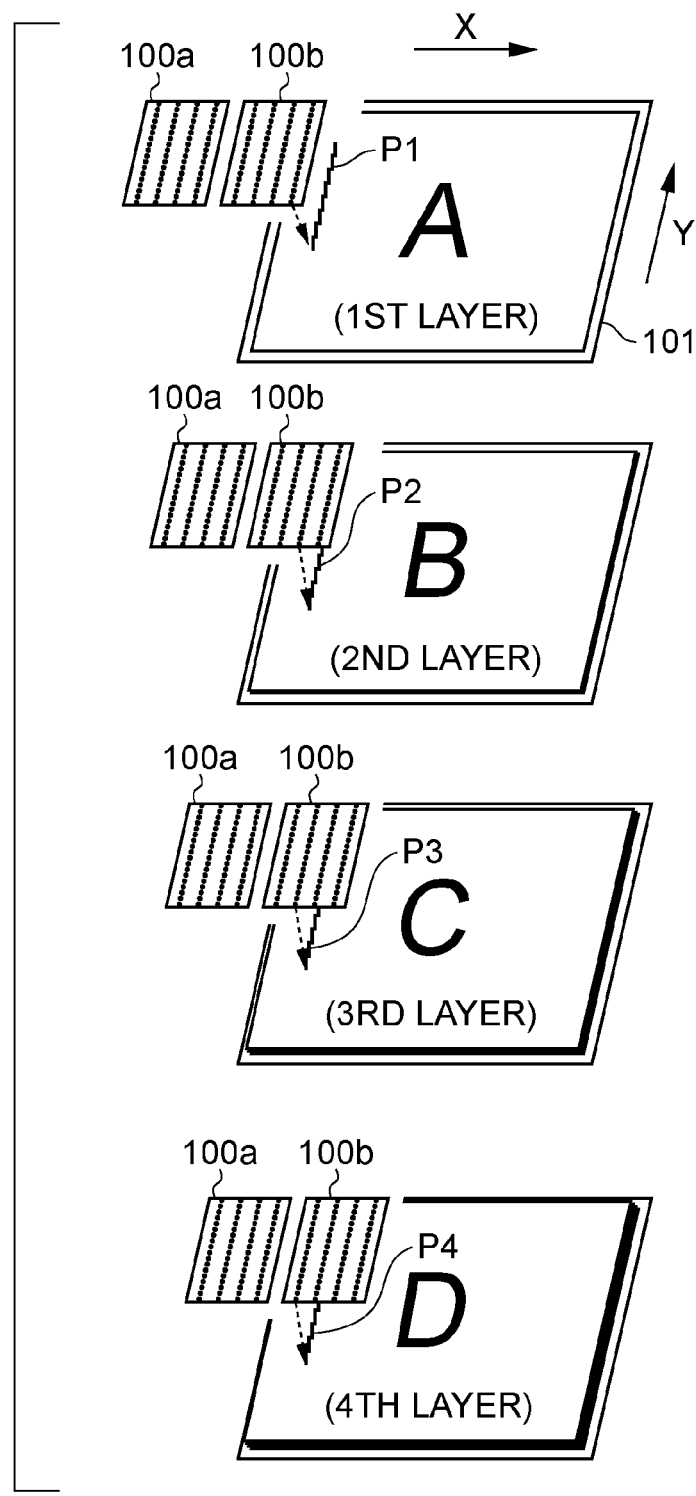
FIG. 9 shows an exemplary process of forming a multi-layered circuit board according to the present invention.
Figure 10A:
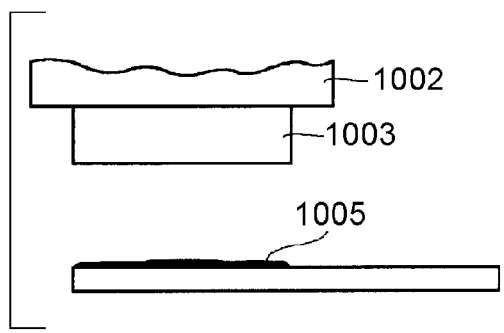
FIG. 10A to FIG. 10C show problems in known examples.
Figure 10B:
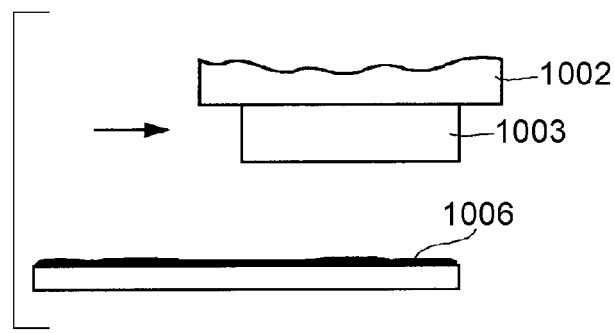
Figure 10C:
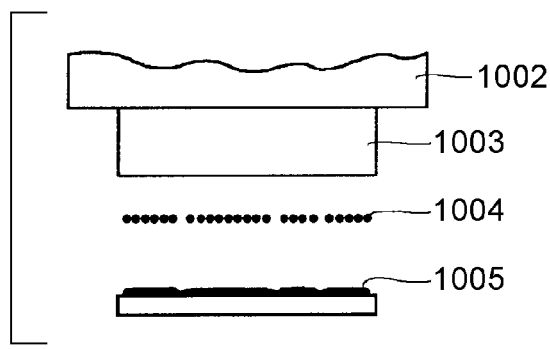

Specifically, FIG. 9 shows the heads 100a and 100b, each having four nozzle rows. In this example, a pattern P1, a pattern P2, a pattern P3, and a pattern P4 on the first layer (A), second layer (B), third layer (C), and fourth layer (D), respectively, are formed of the same material. The pattern P1 is formed with a nozzle row on the right end (FIG. 9) of the head 100b. To form the pattern P2, the heads 100a and 100b are displaced in the carriage moving direction (X direction). The pattern P2 can be formed with the second nozzle row from the right end (FIG. 9) of the head 100b. Then, in a similar manner, the heads 100a and 100b are displaced in the carriage moving direction (X direction). The pattern P3 can be formed with the third nozzle row from the right end (FIG. 9 of the head 100b, and the pattern P4 can be formed with the fourth nozzle row from the right end (FIG. 9) of the head 100b. It is also possible that the heads 100a and 100b are configured to be displaced in both the X and Y directions.

First Exemplary Embodiment

As shown in FIG. 2, after the circuit pattern A (first layer) is formed and fixed to the substrate 101, before the formation of the circuit pattern B (second layer), the head 100a, serving as a "conductive" head, and the head 100b, serving as an "insulating" head, are displaced together to shift the drawing start position by ¼ of the width of the heads 100a and 100b. Then, in the circuit pattern C (third layer), the drawing start position is away from the initial position by ½ of the width of the heads 100a and 100b, and in the circuit pattern D (fourth layer), the drawing start position is away from the initial position by ¾ of the width of the heads 100a and 100b. In other words, every time a new layer is to be formed on top of the previous one, the nozzle position of the heads 100a and 100b is shifted by ¼ of the head width in the direction of the nozzle row.

Figure 3A:
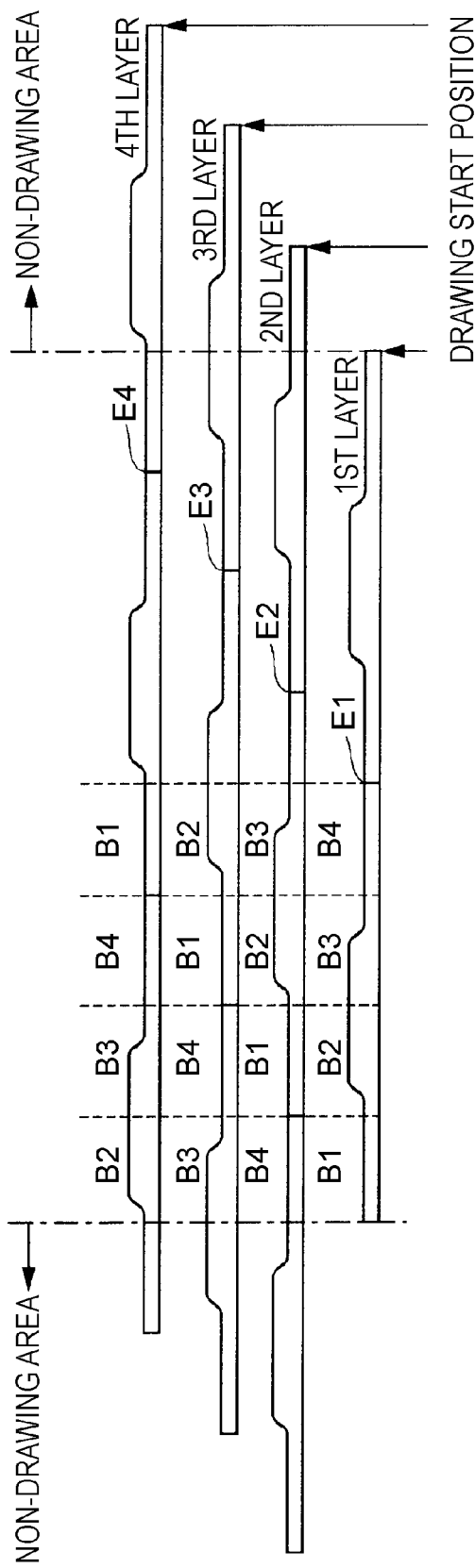
FIG. 3A and FIG. 3B are cross-sectional views for illustrating a multi-layered circuit board according to the first exemplary embodiment.
Figure 3B:
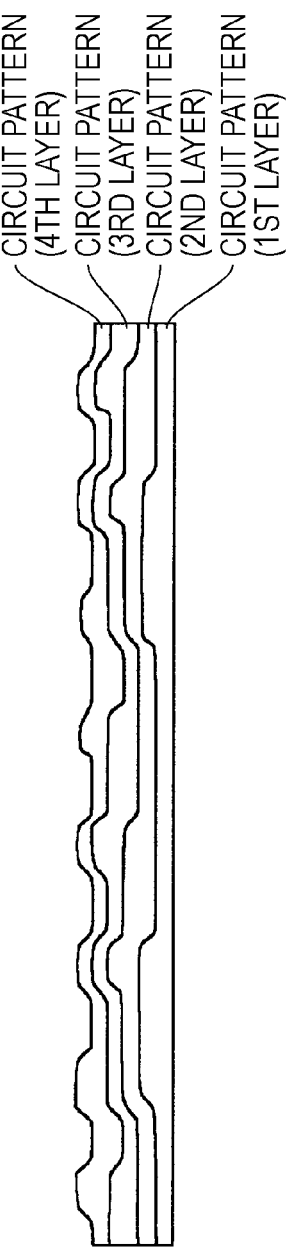

FIG. 3A shows a cross-sectional profile of the multi-layered circuit board produced in the manner described above. To prevent solutions from being ejected onto non-drawing areas (indicated by "N" in FIG. 3A) outside the circuit pattern areas, a mask processing is performed when the computer creates drawing data. In the present exemplary embodiment, every time a new circuit pattern is to be formed on top of the previous one, the drawing start position is shifted by ¼ of the head width, as indicated by S1 to S4 in FIG. 3A. Therefore, raised portions in each layer as shown in FIG. 3B are spread out. Even if four layers are stacked, a level difference on the top surface of the four layers is as small as the level difference in a single layer. This is because, in any section of the circuit board, all four blocks (B1, B2, B3, and B4) of the entire heads 100a and 100b are used to form the four layers. Thus, variations in the thickness of layers depending on the nozzle position can be smoothed out.

Operations involved in such processing do not necessarily have to be performed as described above. For example, the amount of shift (displacement) of the drawing start position can be ½ of the head width in the second layer, ¾ of the head width in the third layer, and ¼ of the head width in the fourth layer.

The effects of the above-described smoothing achieved in the four-layered circuit board can also be achieved in a multi-layered circuit board with ten or more layers. For example, if the drawing start position is shifted by 1/S ("S" denotes the number of layers of a multi-layered circuit board) of the head width W every time before a new layer is formed on top of the previous one, the resulting level difference in the complete multi-layered circuit board is consistently as small as the level difference in a single circuit pattern layer, regardless of the number of layers of the multi-layered circuit board. In the present exemplary embodiment, a level difference on the surface of the complete multi-layered circuit board appears to be as large as the thickness of a single circuit pattern in the drawings, which are exaggerated for purposes of clear explanation. However, as described above, since variations in the amount of droplets ejected from different nozzles are normally 20% or less, and since the maximum level difference remaining in an actual multi-layered circuit board is equal to or less than ⅕ of the thickness of a single circuit pattern, no failure occurs in the multi-layered circuit board.

In the present exemplary embodiment, to smooth out variations in the thickness of a section corresponding to the entire ejection surface of the heads, the amount of displacement L of the heads is set at 1/S ("S" denotes the number of layers of the multi-layered circuit board) of the length W of the nozzle rows. However, the amount of displacement L can be determined by $L = W*N/S$, where N is an integer ranging from 1 to (S−1). When variations in thickness occur randomly regardless of the position of the heads, the amount of displacement can be determined as appropriate. Moreover, the effects of smoothing can be achieved even if the amount of displacement in each layer is not made consistent.

In the present exemplary embodiment, even if variations in the thickness of a circuit pattern layer occur due to problems in the ejection performance of the heads, unevenness remaining on the surface of the complete multi-layered circuit board can be minimized. The same effects can also be achieved with respect to level differences (such as those indicated by E1 to E4 in FIG. 3A) that occur at boundaries between adjacent scans.

Second Exemplary Embodiment

Figure 4:
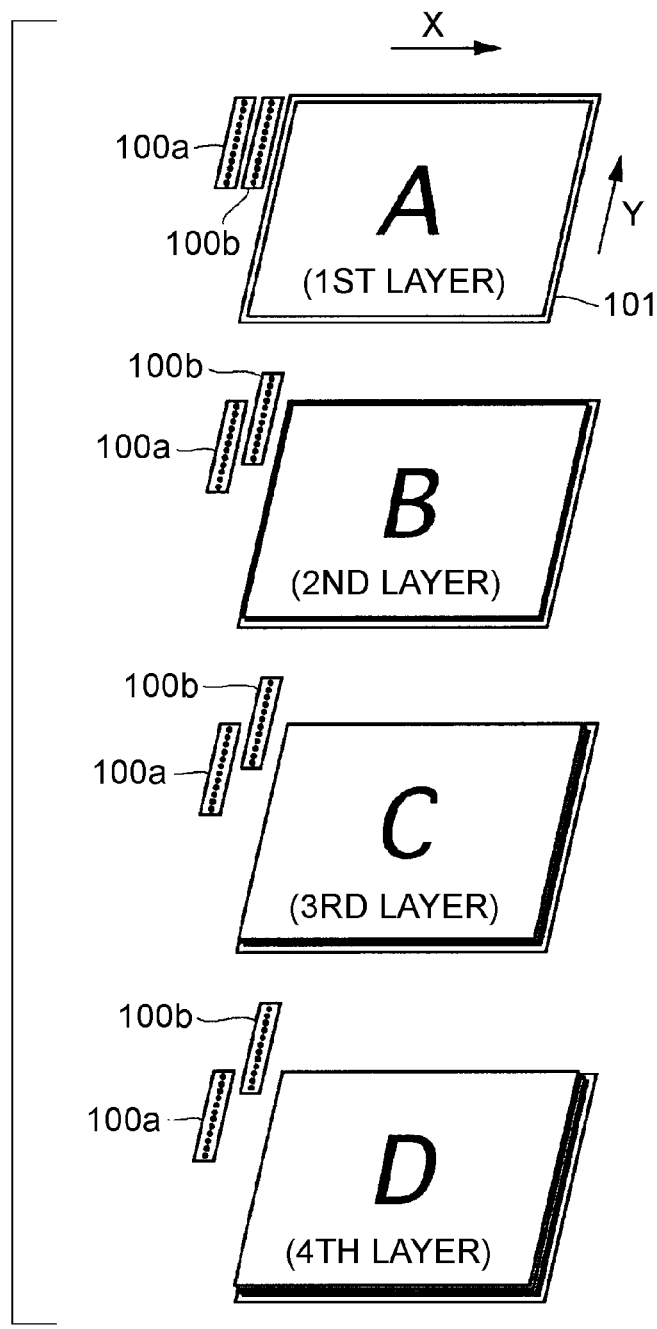
FIG. 4 shows a process of forming a multi-layered circuit board according to a second exemplary embodiment of the present invention.

In the first exemplary embodiment, the head 100a, serving as a "conductive" head, and the head 100b, serving as an "insulating" head, are displaced together. However, in the second exemplary embodiment, only the head 100b is displaced as shown in FIG. 4. In a typical circuit pattern layer formed by liquid ejection, all areas except the area of a conductive pattern for connection between the terminals of electronic devices are occupied by the area of an insulating pattern. Since the conductive pattern is made up of fine traces with a diameter of several tens of micrometers, the circuit pattern layer is mostly occupied by the insulating pattern. Therefore, conductive patterns are normally not stacked in layers and thus, there is virtually no increase in level difference on top thereof. On the other hand, most portions of insulating patterns, each occupying a substantial part of a single circuit pattern layer, are vertically stacked and thus, there is a substantial increase in level difference on top thereof.

Therefore, in the present exemplary embodiment, every time a new layer is formed on top of the previous one, only the head 100b, serving as an "insulating" head, is displaced by ¼ of the head width so that unevenness on top of the insulating patterns only can be smoothed out.

As in the case of the first exemplary embodiment, the amount of shift (displacement) of the drawing start position can be, for example, ½ of the head width in the second layer, ¾ of the head width in the third layer, and ¼ of the head width in the fourth layer. Also, when variations in thickness occur randomly regardless of the position of the heads, the amount of displacement can be determined as appropriate. Moreover, the amount of displacement in each layer does not have to be made consistent.

While the present exemplary embodiment deals with a circuit pattern including both a conductive pattern and an insulating pattern, a similar effect can be achieved in an insulating layer for completely insulating two circuit patterns, that is, in a circuit pattern which only includes an insulating pattern.

When power source layers or ground layers, each of which is mostly occupied by a conductive pattern, are stacked in layers, a similar effect can be achieved by displacing a "conductive" head, not an "insulating" head.

Third Exemplary Embodiment

Figure 5:
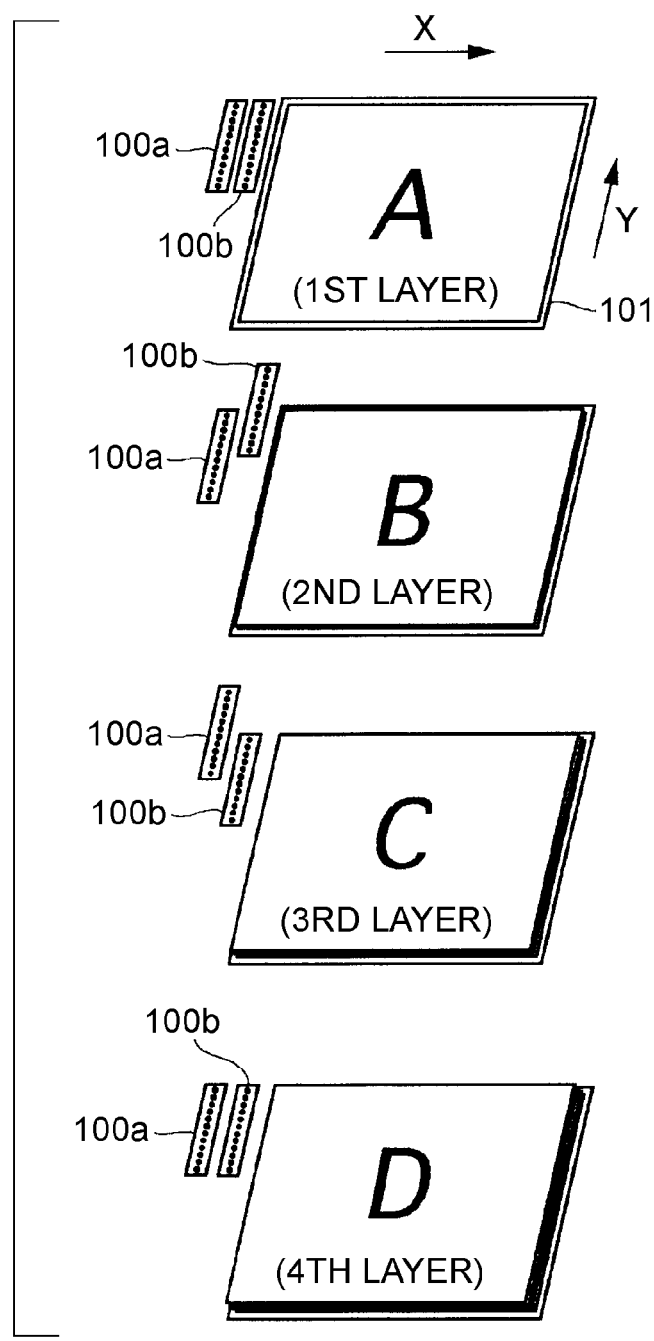
FIG. 5 shows a process of forming a multi-layered circuit board according to a third exemplary embodiment of the present invention.

In the first exemplary embodiment described above, the head 100a, serving as a "conductive" head, and the head 100b, serving as an "insulating" head, are displaced by the same amount. However, in the third exemplary embodiment, as shown in FIG. 5, the amount of displacement of the head 100a differs from that of the head 100b. If the characteristics of variations in the thickness of a circuit pattern caused by the use of the head 100a is different from those caused by the use of the head 100b due to, for example, differences in the manufacturing methods of the heads 100a and 100b, the amount of displacement appropriate for each of the heads 100a and 100b can be set to achieve a multi-layered circuit board with less unevenness.

Figure 8A:
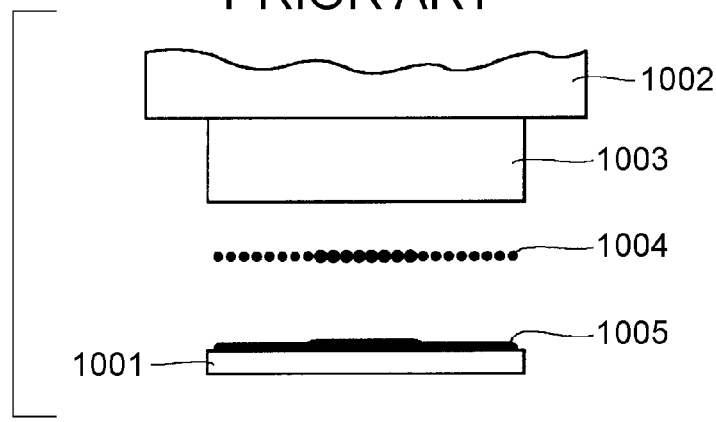
FIG. 8A to FIG. 8C each show variations in the amount of ejection and the resulting thickness of a circuit pattern.
Figure 8B:
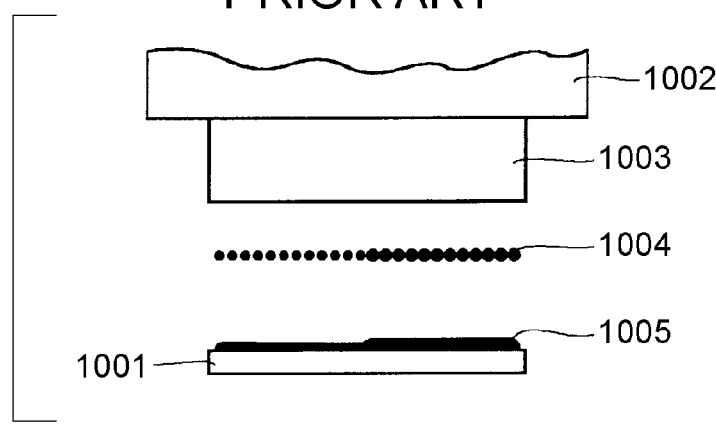

For example, if the use of a "conductive" head results in variations in the thickness of a circuit pattern as shown in FIG. 8A whereas the use of an "insulating" head results in variations as shown in FIG. 8B, the amount of displacement appropriate for the conductive head is ½ of the head width whereas the amount of displacement appropriate for insulating head is ⅓ of the head width. In this case, unevenness in the multi-layered circuit board can be minimized by individually determining the amount of displacement for each head.

Fourth Exemplary Embodiment

Figure 6:
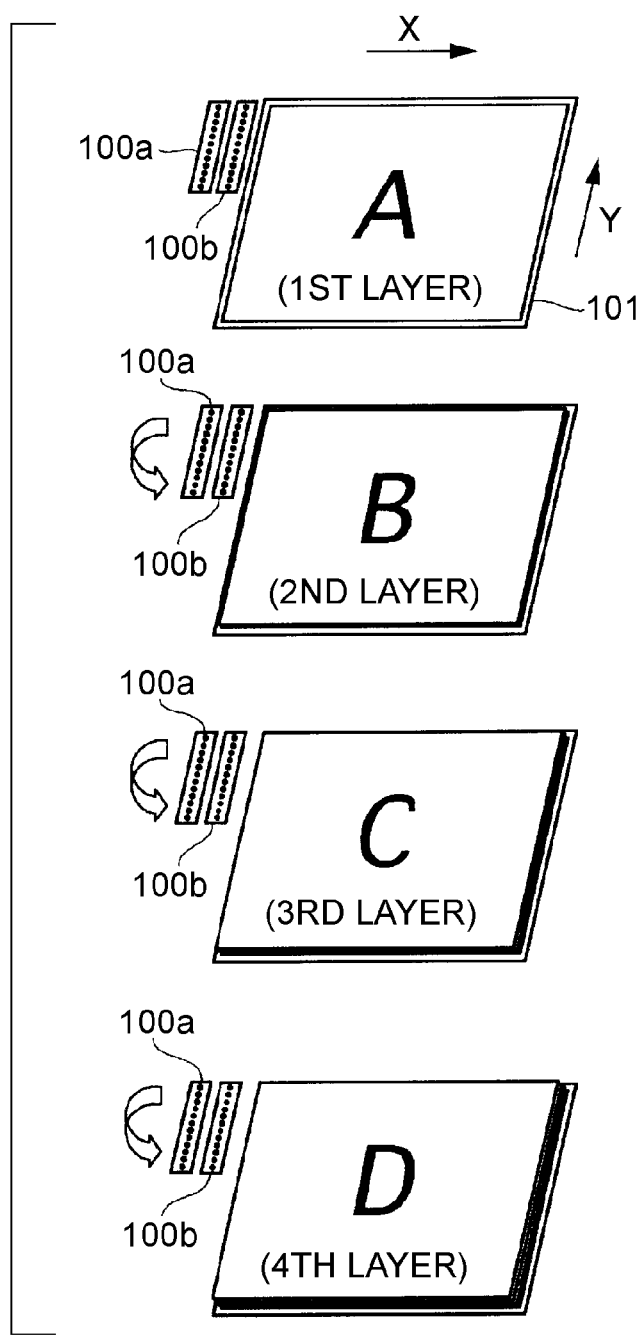
FIG. 6 shows a process of forming a multi-layered circuit board according to a fourth exemplary embodiment of the present invention.
Figure 8C:
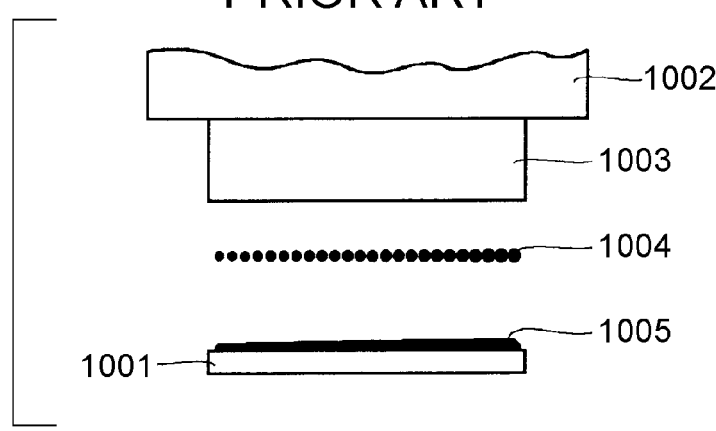

As shown in FIG. 8C, there will be cases where the use of the heads 100a and 100b causes the thickness of the resulting circuit pattern to gradually increase from left to right. In such a case, as shown in FIG. 6, a level difference in the resulting multi-layered circuit board can be minimized by turning the heads 100a and 100b upside down every time a new layer is formed on top of the previous one. Moreover, turning the substrate 101, instead of the heads 100a and 100b, causes no problems and can achieve a similar effect. Also, some types of variations in thickness can be smoothed out by shifting the drawing start position in addition to turning the heads 100a and 100b upside down.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-181667 filed Jun. 22, 2005, which is hereby incorporated by reference herein in its entirety.

What is claimed is:

1. A multi-layered circuit pattern forming method comprising:

forming a multi-layered circuit pattern on a substrate by ejecting solutions onto the substrate from a liquid ejection head with a nozzle row including a plurality of nozzles while repeating relative scanning movement between the liquid ejection head and the substrate in order to stack multiple layers of the multi-layered circuit pattern, wherein, when a layer is formed above another layer, using a nozzle row being the same as a nozzle row used for forming the another layer, the liquid is ejected by having the position of the nozzles with respect to the substrate shifted in the direction of the nozzle row so as to have liquid ejected from different nozzles on the same nozzle row stacked in a stacking direction; and wherein an amount of displacement of start position for each successive stacked printer layer with respect to immediate previous printed layer (L) in the direction of the nozzle row is determined by $L=W*N/S$, where (W) is a length of the nozzle row, (S) is an integer equal to or more than 5 representing a number of layers of the multilayered circuit board, and (N) is an integer ranging from 1 to (S-1).

2. The multi-layered circuit pattern forming method according to claim 1, wherein the position of the nozzles with respect to the substrate is relatively reversed.

3. The multi-layered circuit pattern forming method according to claim 1, further comprising fixing each layer formed.

4. The multi-layered circuit pattern forming method according to claim 1, wherein the liquid ejection head is scanned relatively to the substrate, and the scanning direction (X direction) is perpendicular to the direction of the nozzle row (Y direction).

5. The multi-layered circuit pattern forming method according to claim 1, wherein the circuit pattern includes a conductive pattern and an insulating pattern, and the multi-layered circuit pattern forming method according to claim 1 is used when a pattern material occupying a substantial part of the circuit pattern is ejected.

6. The multi-layered circuit pattern forming method according to claim 1, wherein the number of the liquid ejection head is multiple, and the amount of shift of the liquid ejection head is set individually for each head.

* * * * *